United States Patent [19]
Fuji et al.

[11] 4,366,705
[45] Jan. 4, 1983

[54] THROTTLE OPENING DETECTOR FOR INTERNAL COMBUSTION ENGINE

[75] Inventors: Takiji Fuji, Anjo; Toshio Takaichi, Aichi; Shoji Yokoyama; Hidehiro Kondo, both of Anjo, all of Japan

[73] Assignee: Aisin-Warner K.K., Anjo, Japan

[21] Appl. No.: 213,601

[22] Filed: Dec. 5, 1980

[30] Foreign Application Priority Data

Dec. 5, 1979 [JP] Japan .................................. 54-157843

[51] Int. Cl.³ .......................................... G01M 15/00
[52] U.S. Cl. .......................................... 73/118; 340/686
[58] Field of Search .......................... 340/686; 73/118; 123/478, 494; 200/153 B, 153 J, 165

[56] References Cited
U.S. PATENT DOCUMENTS
4,205,377  5/1980  Oyama et al. .................. 123/494 X

FOREIGN PATENT DOCUMENTS
985911  3/1965  United Kingdom ................ 340/686

Primary Examiner—Jerry W. Myracle
Attorney, Agent, or Firm—Cooper, Dunham, Clark, Griffin & Moran

[57] ABSTRACT

A throttle opening detector for internal combustion engine is composed of a slide contact device which has first and second contacts with potential periodically varying in pulse form corresponding to throttle opening variation, phase difference of pulses beteeen said first and second contacts being a fourth of the period, and of a throttle opening reading device which reads out throttle opening from the potential variation in the first and second contacts and variations of exclusive-OR of potential signals in both contacts. The throttle opening detector enables to detect throttle opening precisely using a cheap micro-computer in 2 bits and to carry out the initial adjustment automatically.

6 Claims, 21 Drawing Figures

THROTTLE OPENING DETECTOR FOR INTERNAL COMBUSTION ENGINE

BACKGROUND OF THE INVENTION

1. Field of the Invention

The present invention relates to a throttle opening detector for internal combustion engine installed in vehicles.

2. Description of the Prior Art

When a micro-computer is used to control an automatic transmission apparatus or fuel amount supplied to an engine of vehicles, throttle opening should be detected as precisely as possible for suitable control. In conventional throttle opening detectors, however, binary code was usually used to indicate throttle opening. In binary code, the indication is divided into 8 steps at 3 bits or 16 steps at 4 bits therefore the accuracy was insufficient to indicate throttle opening.

SUMMARY OF THE INVENTION

An object of the present invention is to provide an apparatus for detecting throttle opening precisely using a micro-computer in 2 bits.

Another object of the present invention is to provide a throttle opening detector in which initial adjustment can be automatically carried out.

DETAILED DESCRIPTION OF THE PREFERRED EMBODIMENTS

The present invention is now described in more detail with reference to preferred embodiments thereof shown in the accompanying drawings.

A throttle opening detector in the present invention is composed of: a throttle opening detector for internal combustion engine comprising a slide contact device which has first and second contacts, and a throttle opening reading device which reads out throttle opening by the potential variation in the first and second contacts, wherein the potential variation of said first contact and the potential variation of said second contact are alternatively output by said slide contact, and the throttle opoening reading device reads out throttle opening variation by variation of exclusive-OR of potential signals in both contacts.

Figure 1:
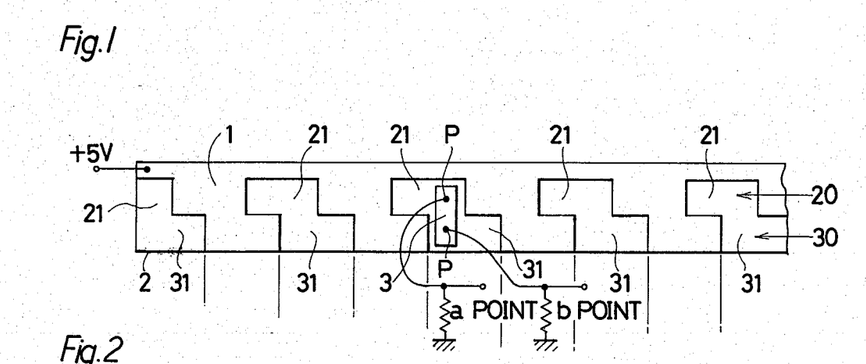
FIG. 1 is a front view of a slide contact device.

FIG. 1 shows a slide contact device. An electrode plate 1 of flat band is supplied with 5 volts to the earth potential and adhered to an insulation plate 2. The electrode plate 1 comprises an upper punched hole train 20 and a lower punched hole train 30. The upper train 20 has a plurality of rectangular punched holes 21, 21 . . . spaced at regular intervals along the longitudinal direction so that length of the electrode portion is equal to that of the punched portion. The lower train 30 has a plurality of rectangular punched holes 31, 31 . . . in similar manner to the upper train 20, but there is deviation of a half of the hole length between the upper and lower trains. A sliding plate 3 slides on the electrode plate 1 and moves along the longitudinal direction in cooperation with an acceleration pedal at a driver seat of a vehicle for varying throttle opening. The sliding plate 3 is provided with a first contact $P_1$ and a second contact $P_2$ corresponding to the upper train 20 and the lower train 30 respectively.

Figure 2:
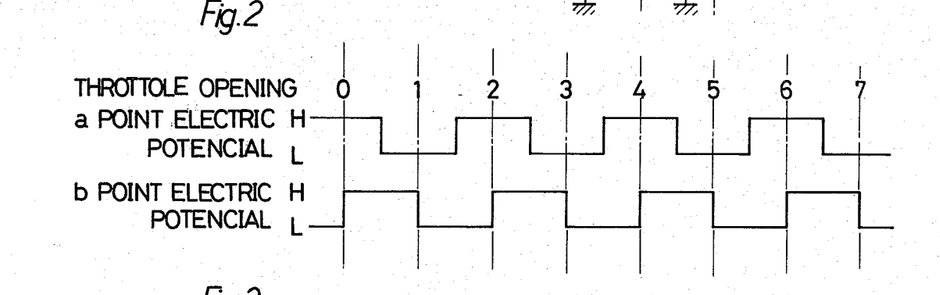
FIG. 2 is a wave-form chart of output pulse.
Figure 3:
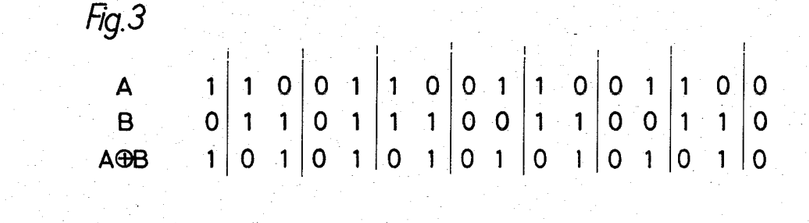
FIG. 3 is a table of Boolean algebra.

Performance of the slide contact device is now described. As throttle opening increases, the sliding plate 3 transfers from the left to the right in FIG. 1. When the first contact $P_1$ or the second contact $P_2$ contacts with the electrode plate 1, potential A or B detected at point a of the contact $P_1$ or point b of the contact $P_2$ becomes 5 volts (high level) as shown in FIG. 2; when the contact $P_1$ or $P_2$ contacts with the punched portion, potential at the point a or b becomes 0 (low level). Thus the potential signal A or B becomes periodic pulse form with equal interval at high level and low level, and the deviation between A and B is a fourth of the period. The output pulse period can be reduced into a desired amount by varying the hole length and punching pitch. FIG. 3 shows a table of Boolean algebra corresponding to output pulses A and B in FIG. 2 and exclusive-OR of A and B.

Figure 4:
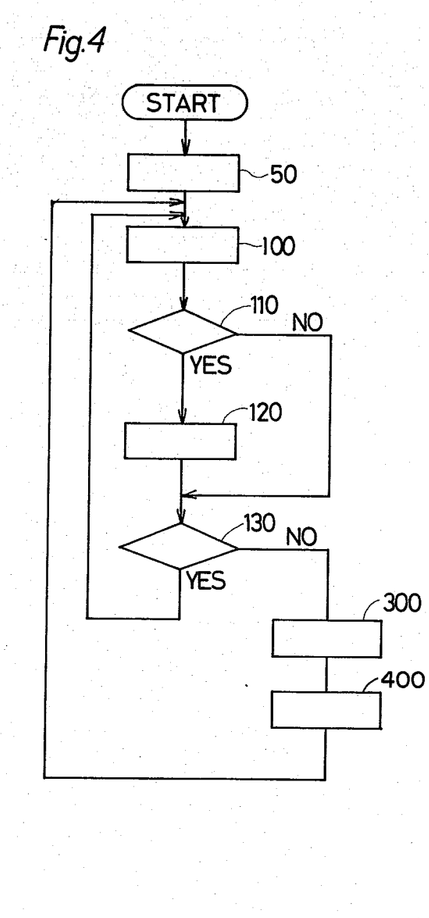
FIG. 4 is a flow chart of a throttle opening reading device.
Figure 5:
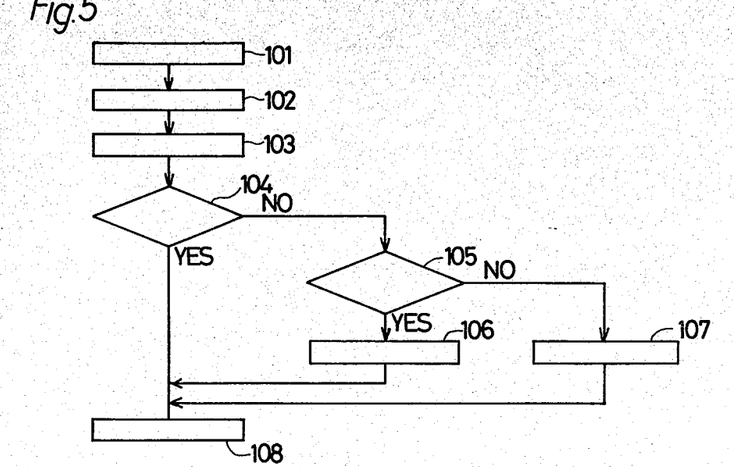
FIG. 5 is a flow chart of subroutine of the throttle opening reading device.

FIG. 4 shows a flow chart of the throttle opening reading device. Throttle opening at the start time is set to "0" step at unit 50, and then throttle opening reading subroutine 100 acts as shown in FIG. 5. The output potential signals A and B are read out at unit 101 and unit 102, and unit 103 produces exclusive-OR of A and B. The newly read value of A is verified for coincidence with the previously read value of A at unit 104. If the coincidence exists, the throttle opening is determined not to vary and A is set to the newly read value at unit 108. If the coincidence does not exist, unit 105 determines whether exclusive-OR becomes "1". As clearly understood from FIG. 3, A is changed and exclusive-OR is changed from "0" to "1", when throttle opening increases and the sliding plate 3 is transferred from the left to the right. Then the number of steps of throttle opening is determined to increase by one step from the previous step and the new value is set at unit 106. Exclusive-OR is changed from "1" to "0" and A is changed, when throttle opening decreases and the sliding plate 3 is transferred from the right to the left as shown in FIG. 3. The number of steps of throttle opening is determined to decrease by one step from the previous step at unit 107, and then A is set to the new value at unit 108.

Unit 110 now determines whether the number of steps of the newly set throttle opening at subroutine 100 is less than the zero step. If the value is negative, the newly set throttle opening is determined to be in the zero step at unit 120. By repeating this process, initial adjustment of throttle opening is automatically carried out in the case that the throttle opening set to the zero step at the start is not in minimum state. Furthermore, unit 130 determines whether a shift lever to operate a manual valve in hydraulic control unit of the automatic transmission apparatus is now shifted in position of park (P) or neutral (N). Vehicle speed information is inputted to vehicle speed reading unit 300 and automatic transmission output is generated by automatic transmission unit 400. When the shift lever is in position of P or N, the process is returned to throttle opening reading subroutine 100.

Figure 6:
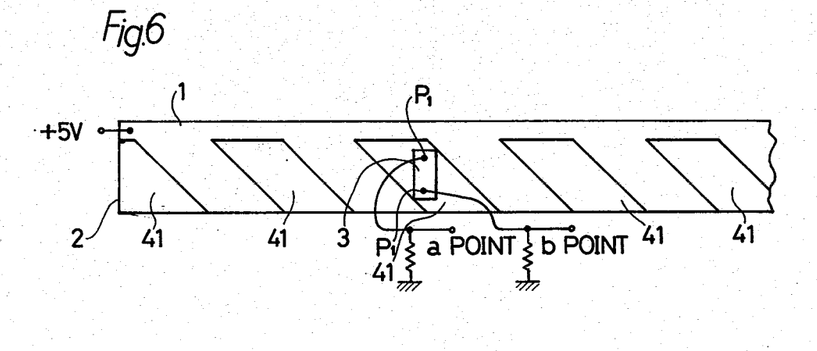
FIG. 6 is a front view of a slide contact device in another embodiment.

Referring to FIG. 6 illustrating a slide contact device in another embodiment, an electrode plate 1 is provided with cut-away portions 41, 41 . . . in parallelogram with inclination at 45°, spaced at regular intervals along the longitudinal direction. When a sliding plate 3 is transferred in the longitudinal direction, output potential signal in a first contact $P_1$ and a second contact $P_2$ becomes periodic pulse form as shown in FIG. 2.

Figure 7A:
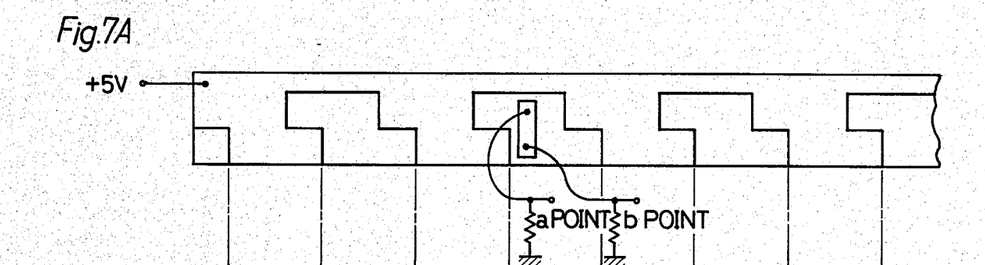
FIG. 7A is a front view of a slide contact device in another embodiment.
Figure 7B:
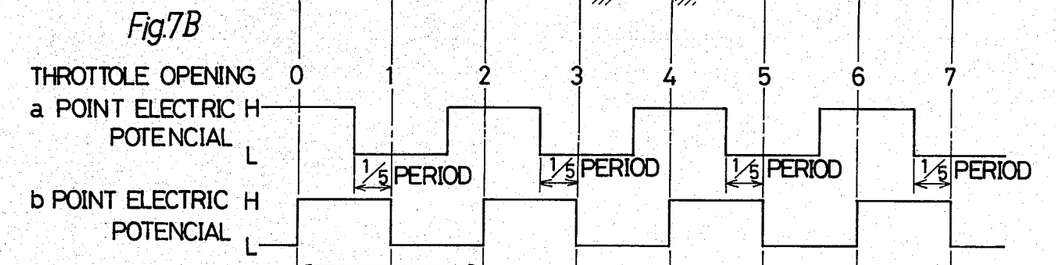
FIG. 7B is a wave-form chart of output pulse of the slide contact device shown in FIG. 7A.
Figure 7C:
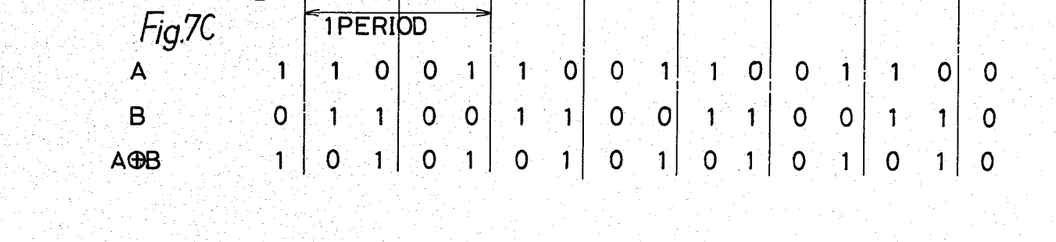
FIG. 7C is a table of Boolean algebra of the slide contact device shown in FIG. 7A.
Figure 8A:
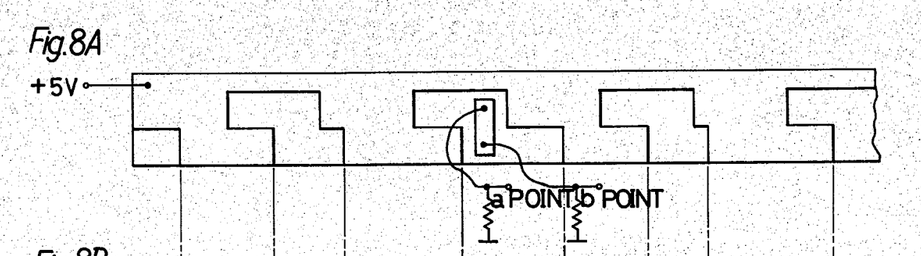
FIG. 8A is a front view of a slide contact device in another embodiment.
Figures 8B, 8C:
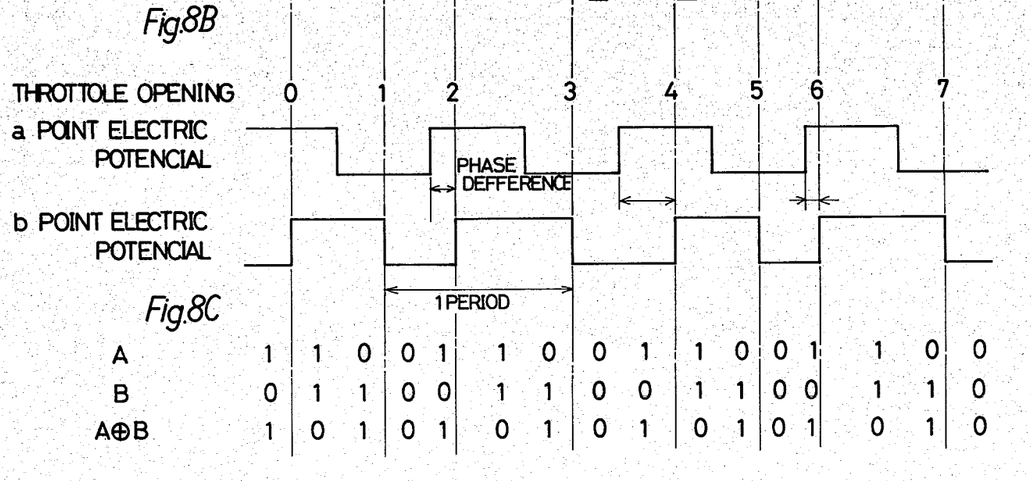
FIG. 8B is a wave-form chart of output pulse of the slide contact device shown in FIG. 8A.
FIG. 8C is a table of Boolean alegebra of the slide contact device shown in FIG. 8A.

FIG. 7A shows an another embodiment. In said embodiment, the phase of the upper punched hole train is different the phase of the lower punched hole train in 1/5 period. In this case, output pulse of point a and point b is shown in wave-form chart of FIG. 7B respectively and FIG. 7C shows a table of Boolean algebra corresponding to output pulses A and B shown in FIG. 7B and exclusive-OR of A and B. FIG. 8A shows an another embodiment. In said embodiment, phase differences of the upper punched hole train and the lower punched hole train are settled so as to change in each period. In this case, output pulse of point a and point b is shown in wave-form chart of FIG. 8B respectively and FIG. 8C shows a table of Boolean algebra corresponding to output pulses A and B shown in FIG. 8B and exclusive-OR of A and B.

Figures 9A, 9B:
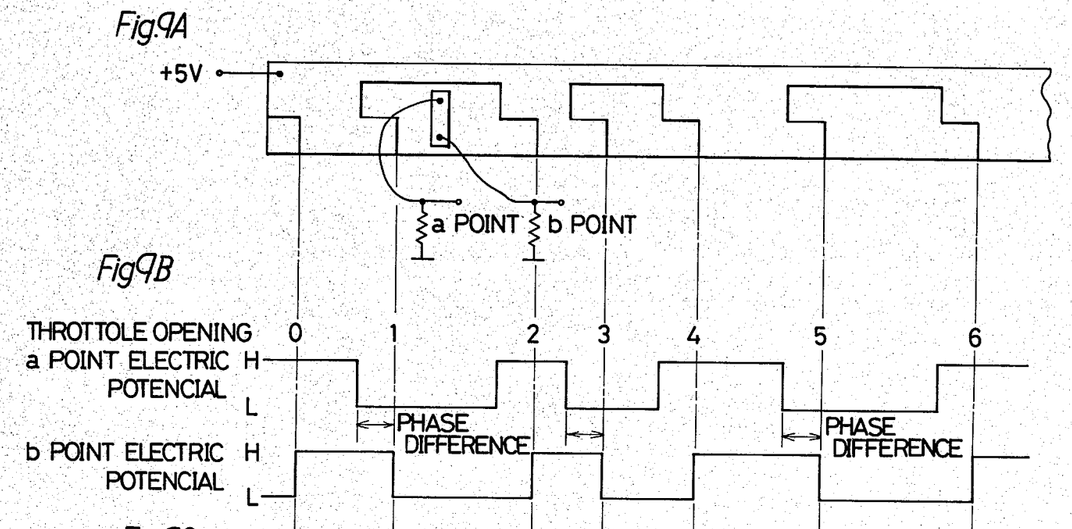
FIG. 9A is a front view of a slide contact device in another embodiment.
FIG. 9B is a wave-form chart of output pulse of the slide contact device shown in FIG. 9A.
Figure 9C:
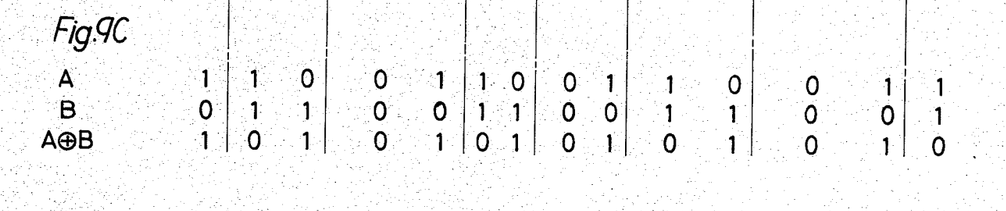
FIG. 9C is a table of Boolean algebra of the slide contact device shown in FIG. 9A.

FIG. 9A shows an another embodiment. In said embodiment, phase differences of the upper punched hole train and the lower punched hole train are settled so as to be unchangeable, and each period is settled so as to be changeable. In this case, output pulse of point a and point b is shown in wave-form chart of FIG. 9B respectively and FIG. 9C shows a table of Boolean algebra corresponding to output pulses A and B shown in FIG. 9B and exclusive-OR of A and B.

Figures 10A, 10B:
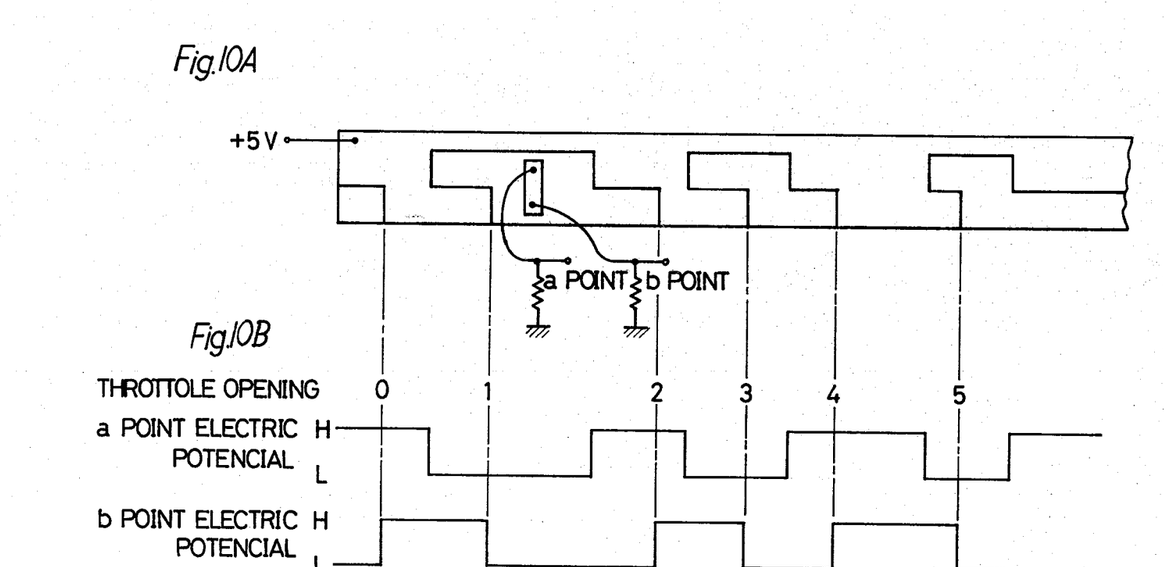
FIG. 10A is a front view of a slide contact device in another embodiment.
FIG. 10B is a waveform chart of output pulse of the slide contact device shown in FIG. 10A.
Figure 10C:
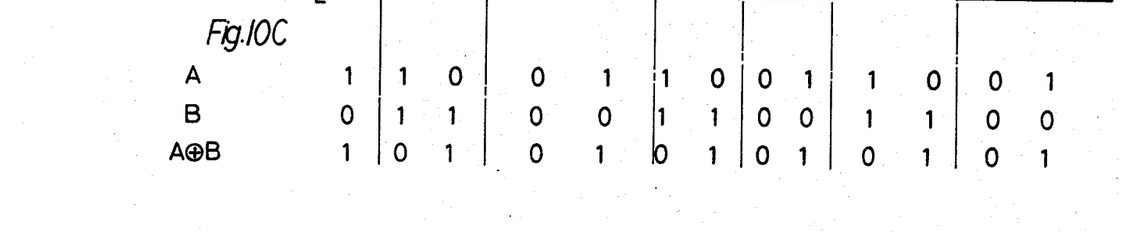
FIG. 10C is a table of Boolean algebra of the slide contact device shown in FIG. 10A.

FIG. 10A shows an another embodiment. In said embodiment, phase differences of the upper punched hole train and the lower punched hole train and period are settled so as to change together. In this case, output pulse of point a and point b is shown in wave-form chart of FIG. 10B respectively and FIG. 10C shows a table of Boolean algebra corresponding to output pulses A and B shown in FIG. 10B and exclusive-OR of A and B.

Figures 11A, 11B, 11C:
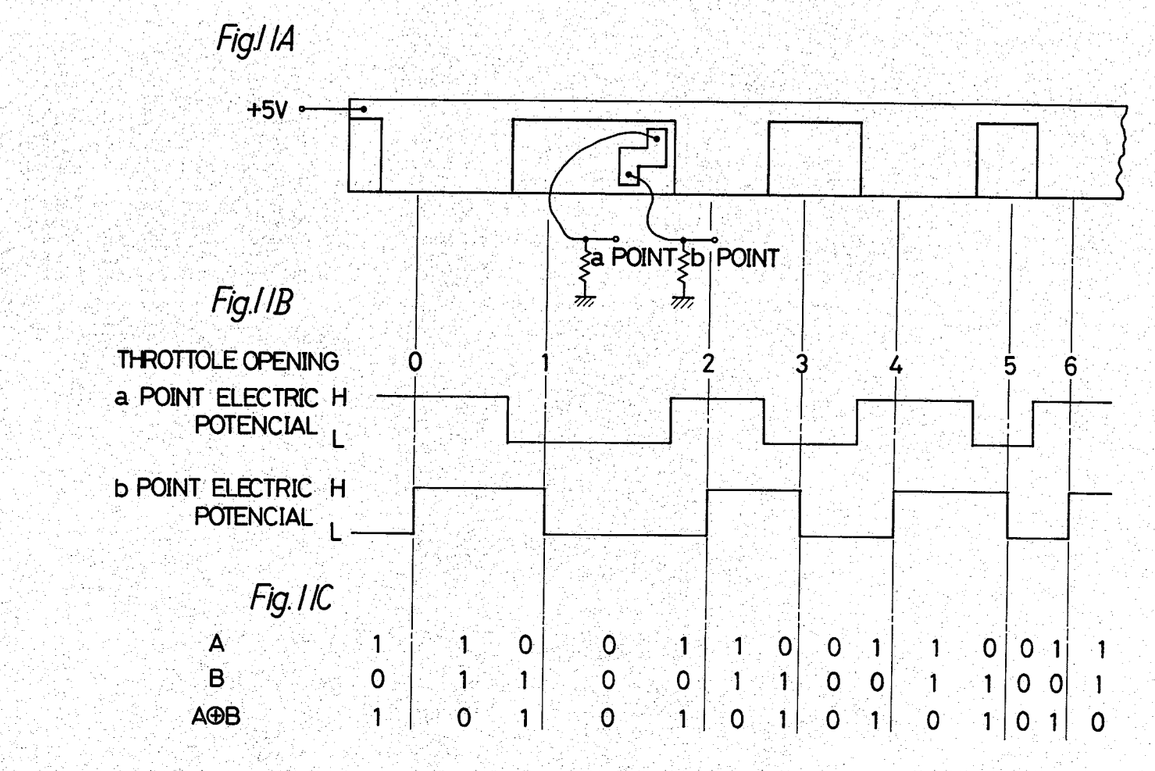
FIG. 11A is a front view of a slide contact device in another embodiment.
FIG. 11B is a wave-form chart of output pulse of the slide contact device shown in FIG. 11A.
FIG. 11C is a table of Boolean algebra of the slide contact device shown in FIG. 11A.

FIG. 11A shows an another embodiment. In said embodiment, period is changeable and each phase difference of the upper punched hole train and the lower punched hole train is 0, and the first contact $P_1$ of sliding plate is positioned so as to shift in a fixed distance in longitudinal direction from the second contact $P_2$. In this case, output pulse of point a and point b is shown in waveform chart of FIG. 11B respectively and FIG. 11C shows a table of Boolean algebra corresponding to output pulses A and B shown in FIG. 11B and exclusive-OR of A and B.

The slide contact device may be stationary at the contacts and movable at the electrode plate, or the electrode plate may be formed in cylinder or disc for rotationary motion. Also any shape of cup-away or punched portions in the electrode plate may be used, as long as output potential signal in the first and second contacts becomes periodic pulse form in FIG. 2.

In addition to use in automatic transmission apparatuses, a throttle opening detector in the present invention can be used in apparatuses for controlling engine fuel amount or other apparatuses to receive throttle opening as input.

A throttle opening detector in the present invention can obtain a desired number of output pulses corresponding to total stroke of a sliding plate in a slide contact device, thereby throttle opening is precisely detected using binary code in 2 bits. Furthermore the initial state correction of throttle opening in the throttle opening reading device enables to adjust the initial state automatically.

What is claimed is:

1. A throttle opening detector for internal combustion engine comprising a slide contact device which has first and second contacts, and a throttle opening reading device which reads out throttle opening by the potential variation in the first and second contacts, wherein the potential variation of said first contact and the potential variation of said second contact are alternatively output by said slide contact, and the throttle opening reading device reads out throttle opening variation by variation of exclusive-OR of potential signals in both contacts.

2. A throttle opening detector according to claim 1, wherein the slide contact device comprises an electrode plate which consists of a punched parts and remaining holeless parts, and a sliding plate which transfers corresponding to throttle opening variation and slides on said electrode plate in the longitudinal plate, wherein said punched parts consist of a upper punched hole train and a lower punched hole train, said first contact takes out the potential variation of said upper punched hole train, and said second contact takes out the potential variation of said lower punched hole train.

3. A throttle opening detector according to claim 2, wherein said upper punched hole train has same pattern as said lower punched hole train and their positions respectively shift in a fixed distance in the longitudinal direction to take out the fixed phase difference and the fixed period from said first contact and second contact.

4. A throttle opening detector according to claim 2, wherein said upper punched hole train has same pattern as said lower punched hole train and their position respectively corresponds without shift and said first contact is positioned so as to shift in the longitudinal direction from said second contact.

5. A throttle opening detector according to claim 2, wherein said upper punched hole train has different pattern from said lower punched hole train and their positions respectively shift in the longitudinal direction to take out the variable phase difference and the variable period from said first contact and second contact.

6. A throttle opening detector according to claim 2, wherein said upper punched hole train has same pattern as said lower punched hole train and their positions respectively shift in the longitudinal direction to take out the variable phase difference and the fixed period from said first contact and second contact.

* * * * *